(12) United States Patent
Chiou

(10) Patent No.: US 9,191,900 B2
(45) Date of Patent: Nov. 17, 2015

(54) COMMUNICATION DEVICE AND POWER CONTROL METHOD THEREOF

(71) Applicant: Wistron Corp., New Taipei (TW)

(72) Inventor: Sheng-Lun Chiou, New Taipei (TW)

(73) Assignee: Wistron Corp., New Taipei (TW)

( * ) Notice: Subject to any disclaimer, the term of this patent is extended or adjusted under 35 U.S.C. 154(b) by 0 days.

(21) Appl. No.: 14/695,005

(22) Filed: Apr. 23, 2015

(65) Prior Publication Data

US 2015/0230186 A1 Aug. 13, 2015

Related U.S. Application Data

(63) Continuation-in-part of application No. 13/938,168, filed on Jul. 9, 2013, now Pat. No. 9,042,936.

(30) Foreign Application Priority Data

Nov. 15, 2012 (TW) .............................. 101142565 A

(51) Int. Cl.
| | |
|---|---|
| *H04W 52/14* | (2009.01) |
| *H04W 52/26* | (2009.01) |
| *H04W 52/36* | (2009.01) |
| *H04B 1/04* | (2006.01) |
| *H04W 52/28* | (2009.01) |

(52) U.S. Cl.
CPC ............ *H04W 52/146* (2013.01); *H04W 52/26* (2013.01); *H04W 52/367* (2013.01); *H04B 2001/0416* (2013.01); *H04W 52/281* (2013.01)

(58) Field of Classification Search
CPC . H04W 52/146; H04W 52/242; H04W 52/40; H04W 52/42
USPC .................. 455/522, 67.11, 127.2, 138, 219; 370/280, 294; 375/267
See application file for complete search history.

(56) References Cited

U.S. PATENT DOCUMENTS

| | | | | |
|---|---|---|---|---|
| 5,659,892 | A * | 8/1997 | Soleimani et al. | 455/103 |
| 2006/0158251 | A1* | 7/2006 | Ichitsubo et al. | 330/126 |
| 2007/0115054 | A1* | 5/2007 | Ichitsubo et al. | 330/126 |
| 2007/0135071 | A1* | 6/2007 | Lee et al. | 455/232.1 |
| 2010/0246705 | A1* | 9/2010 | Shin et al. | 375/267 |
| 2012/0187989 | A1* | 7/2012 | Barnes | 327/157 |
| 2014/0135054 | A1* | 5/2014 | Chiou et al. | 455/522 |

* cited by examiner

*Primary Examiner* — Minh D Dao

(57) ABSTRACT

Mobile devices and power control methods thereof are provided. The power control method, performed by a mobile device, includes: receiving internal information from a memory device; determining an output power range of an amplifier according to the internal information; determining a an amplifier gain switch range of the amplifier based on the output power range, when a transmit power of an uplink signal is within the amplifier gain switch range, amplifying the uplink signal with a first gain mode; and when the transmit power of the uplink signal is outside of the amplifier gain switch range, amplifying the uplink signal with a second gain mode.

20 Claims, 12 Drawing Sheets

COMMUNICATION DEVICE AND POWER CONTROL METHOD THEREOF

CROSS REFERENCE TO RELATED APPLICATIONS

This application is a Continuation-In-Part of pending U.S. patent application Ser. No. 13/938,168, filed Jul. 9, 2013 and entitled "Communication Device and Power Control Method Thereof", which claims the benefit of Taiwan Patent Application No. 101142565, filed on Nov. 15, 2012, and the entirety of which is incorporated by reference herein.

BACKGROUND

1. Field

The present disclosure relates to a power control mechanism, and in particular, a communication device and a power control method thereof.

2. Description of the Related Art

In recent years, users have changed their way of using mobile communication devices such as a smart phone or a tablet, by blogging and sharing their daily life experiences, increasing communication for work and business, and using the mobile communication devices for education and entertainment. Accordingly, network operators have increased the bandwidth for mobile networks in order to meet an expanding range of user applications.

A power amplifier (PA) plays an important role in a radio frequency (RF) transmitter circuit of a mobile communication device, serving to amplify a signal before driving the signal on the communication channel. The PA is typically placed next to the antenna, and consumes the most power in the transmitter circuit. As the requirement for radio bandwidth increases, the power consumption at the transmitter circuit becomes a crucial issue for designers. In order to increase a Power Added Efficiency (PAE) of the PA, the circuit design of the PA deploys several gain modes. The adjacent gain modes overlap with each other. With the employment of PA switch points (PASP) for the gain modes, the power amplifier can provide continuous and stable linear transmit power. Since the PA employs several gain modes, circuit designers are required to consider the overlapping coverage of the gain modes for the transmitter circuit to determine a set of PASPs. The determining of the set of PASPs, negatively impacts circuit performance and battery life of a mobile communication device.

BRIEF SUMMARY OF THE DISCLOSURE

A detailed description is given in the following embodiments with reference to the accompanying drawings.

An embodiment of a power control method is disclosed, performed by a mobile device, comprising: receiving transmit power control information from a wireless communication network; determining an output power range of an amplifier according to the transmit power control information; when the output power range is less than a power range threshold, determining a low-gain switch range as an amplifier gain switch range of the amplifier, wherein the low-gain switch range comprises a first upper bound and a first lower bound; when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound; when a transmit power of an uplink signal is within the amplifier gain switch range, amplifying the uplink signal with a first gain mode; and when the transmit power of the uplink signal is outside of the amplifier gain switch range, amplifying the uplink signal with a second gain mode.

Another embodiment of a power control method is provided, performed by a mobile device, comprising: receiving internal information from a memory device; determining an output power range of an amplifier according to the internal information; when the output power range is less than a power range threshold, determining a low-gain switch range as an amplifier gain switch range of the amplifier, wherein the low-gain switch range comprises a first upper bound and a first lower bound; when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound; when a transmit power of an uplink signal is within the amplifier gain switch range, amplifying the uplink signal with a first gain mode; and when the transmit power of the uplink signal is outside of the amplifier gain switch range, amplifying the uplink signal with a second gain mode.

Another embodiment of a mobile device is revealed, comprising an amplifier, a controller, and an external information circuit. The amplifier is configured to amplify an uplink signal with a gain mode. The controller is configured to receive transmit power control information from a wireless communication network. The external information circuit is configured to determine an output power range of an amplifier according to the transmit power control information. When the output power range is less than a power range threshold, the controller is further configured to determine a low-gain switch range as an amplifier gain switch range of the amplifier, wherein the low-gain switch range comprises a first upper bound and a first lower bound. When the output power range exceeds the power range threshold, the controller is further configured to determine a high-gain switch range as the amplifier gain switch range of the amplifier, wherein the high-gain switch range comprises a second upper bound and a second lower bound, the second upper bound is less than the first upper bound, and the second lower bound is less than the first lower bound. When a transmit power of the uplink signal is within the amplifier gain switch range, the controller is further configured to select a first gain mode as the gain mode of the amplifier. When the transmit power of the uplink signal is outside of the amplifier gain switch range, the controller is further configured to select a second gain mode as the gain mode of the amplifier.

Another embodiment of a mobile device is described, comprising an amplifier, a memory, a controller, and an internal information circuit. The amplifier is configured to amplify an uplink signal with a gain mode. The memory is configured to store internal information. The internal information circuit, configured to receive internal information from the memory device and determine an output power range of an amplifier according to the internal information. When the output power range is less than a power range threshold, the controller is configured to determine a low-gain switch range as an amplifier gain switch range of the amplifier, wherein the low-gain switch range comprises a first upper bound and a first lower bound, when the output power range exceeds the power range threshold, the controller is configured to determine a high-gain switch range as the amplifier gain switch range of the amplifier, wherein the high-gain switch range comprises a second upper bound and a second lower bound, the second upper bound is less than the first upper bound, and the second lower bound is less than the first lower bound, when a transmit power of the uplink signal is within the amplifier gain switch range, the controller is configured to select a first gain mode as the gain mode of the amplifier; and when the transmit power of the uplink signal is outside of the amplifier gain switch range, the controller is configured to select a second gain mode as the gain mode of the amplifier.

Another embodiment of a power control system is described, comprising first and second wireless communication networks and a mobile device. The first and second wireless communication networks are configured to broadcast first and second transmit power control information, respectively. The mobile device is configured determine an active network from the first and second wireless communication networks, receive one of the first and second transmit power control information broadcasted by the active network, determining an output power range of an amplifier according to the received one of the first and second transmit power control information, when the output power range is less than a power range threshold, determining a low-gain switch range as an amplifier gain switch range of the amplifier, wherein the low-gain switch range comprises a first upper bound and a first lower bound, when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound, when a transmit power of an uplink signal is within the amplifier gain switch range, amplifying the uplink signal with a first gain mode; and when the transmit power of the uplink signal is outside of the amplifier gain switch range, amplifying the uplink signal with a second gain mode.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
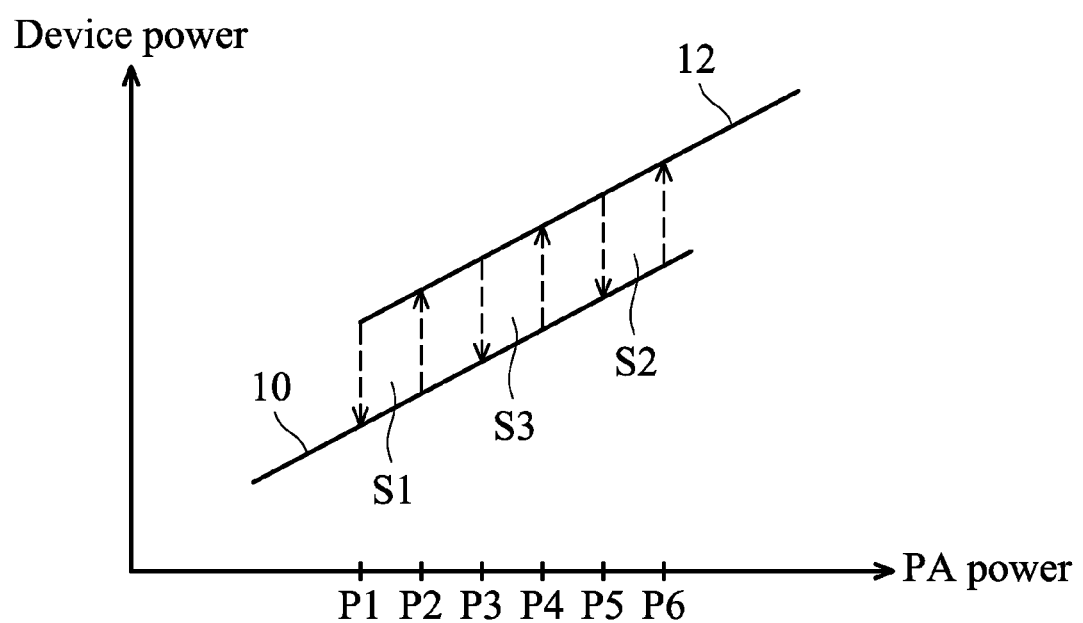
FIG. 1 illustrates a switch mechanism switching a gain mode for a Power Amplifier PA of a communication device according to an embodiment of the disclosure.

FIG. 1 illustrates a switch mechanism switching a gain mode for a Power Amplifier PA of a communication device according to an embodiment of the disclosure, where the horizontal axis represents a power of the PA, and the vertical axis represents a power of the communication device. The embodiment shows two gain modes for the power amplifier PA, including a low-gain mode 10 and a high-gain mode 12. The power amplifier PA is configured to switch between the low-gain mode 10 and the high-gain mode 12 based on one of three possible gain switch ranges S1, S2, and S3, and amplify the power for an uplink signal according to the switched low-gain mode 10 or the high-gain mode 12, thereby driving the amplified uplink signal on an appropriate communication channel. The communication device can select one from the three possible gain switch ranges S1, S2 and S3 based on a characteristic of the required transmit power of the uplink signal, thereby controlling the gain mode adopted by the power amplifier PA. The communication device may be a smart phone, a tablet, a laptop or another electronic device with a wireless communication capability.

After the design architecture of a radio frequency (RF) transmitter circuit is decided, the possible gain switch ranges for the RF transmitter circuit can also be determined, accordingly. The gain switch ranges for the power amplifier PA is an adaptable range between the switching points of the gain modes, or within the range of power P1 through P6 in FIG. 1. Further, the gain switch ranges for the power amplifier PA may include the three possible gain switch ranges S1, S2 and S3.

In the gain switch range S1, when the power amplifier PA is in the low-gain mode 10 and the required PA power exceeds the power P2, the power amplifier PA is configured to switch to the high power mode 12 to amplify the power of the uplink signal. Conversely, when the power amplifier PA is in the high-gain mode 12 and the required PA power is lower than the power P1, the power amplifier PA is configured to switch to the high power mode 10 to reduce the power amplification of the uplink signal. In comparison to the other gain switch ranges S2 and S3, since the switching point of the gain modes falls onto the high-gain mode 12 in advance, the power amplifier PA allows for increased linear amplification headroom while increasing the power consumption. The gain switch range S1 is preferred for the wireless communication systems which require increased modulation such as 16QAM or 64QAM, and increased transmit speed or bandwidth such as the Wideband Code Division Multiple Access (W-CDMA) technology, the Carrier Aggregation (CA) of the Long Term Evolution-Advanced (LTE-A), and the multiplex of the sub-carriers such as an OFDM or multi-layer modulator. The gain switch range S1 can be implemented for the telecommunication technologies such as the versions Rel-5, Rel-6 and Rel-7 (W-CDMA), the versions Rel-8 and Rel-9 (Long Term Evolution, LTE), and the versions Rel-10, Rel-11, and later versions (LTE-A). Similar communication systems include high-speed transmission transmitters for the IEEE 802.11n/ac/ad systems.

In the gain switch range S2, when the power amplifier PA is in the low-gain mode 10 and the required PA power exceeds the power P6, the power amplifier PA is configured to switch to the high power mode 12 to amplify the power of the uplink signal. Conversely, when the power amplifier PA is in the high-gain mode 12 and the required PA power is lower than the power P5, the power amplifier PA is configured to switch to the high power mode 10 to reduce the power amplification of the uplink signal. In contrast to the gain switch range S1, the gain switch range S2 has an increased probability to stay in the low-gain mode 10. As a consequence, the power amplifier PA requires less power consumption. In particularly, the gain switch range S2 may cause signal distortion for certain RF signal transmission modes. For example, certain combinations of modulations in the physical layer or first layer and radio resource scheduling can result in an increased peak-to-average ratio (PAPR). The gain switch range S2 is preferred for wireless communication systems with reduced transmission speeds and modulation technologies, e.g., BPSK or QPSK modulation technologies and multiplex technologies for small numbers of channels in the physical layers.

The gain switch range S3 prevents the power amplifier PA from consuming excessive power as in the gain switch range S1, and insufficient power headroom as in the gain switch range S2, providing an alternative for a flexible and compromised solution for the power amplifier PA.

The embodiments can prolong the battery life of the communication device, providing a solution for dynamically adapting the gain switch range for the power amplifier PA, thus, increasing the battery life of the communication device.

Figure 2:
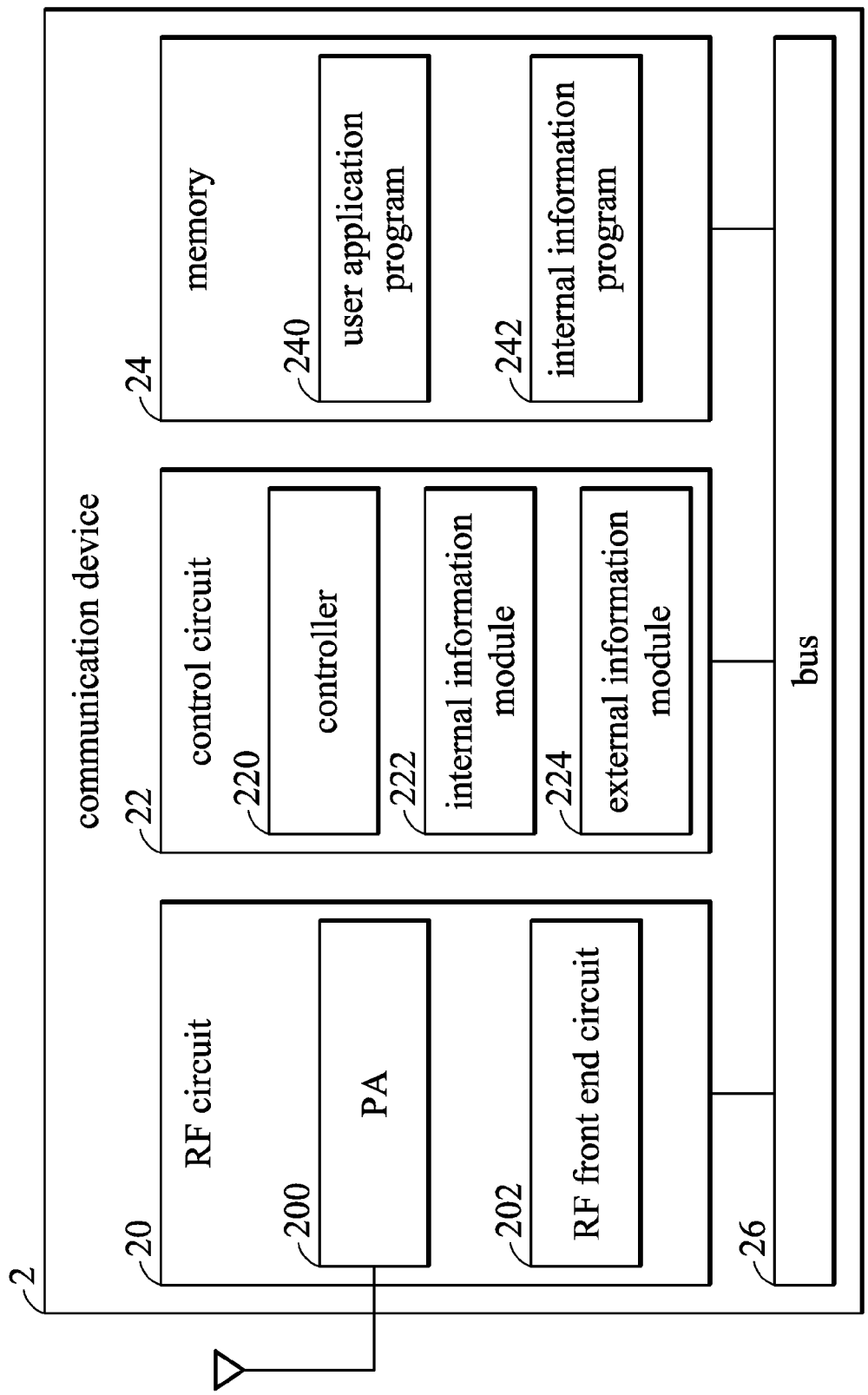
FIG. 2 is a block diagram of a communication device 2 according to an embodiment of the disclosure.

FIG. 2 is a block diagram of a communication device 2 according to an embodiment of the disclosure, including a radio frequency (RF) circuit 20, a control circuit 22, a memory 24 and a bus 26 (one or more transmission interfaces). The RF circuit 20, the control circuit 22 and the memory 24 communicate and exchange data via the bus 26. The communication device 2 can be implemented to realize the multi-switch range mechanism depicted in FIG. 1. In particularly, the communication device 2 is configured to estimate a required power range for the power amplifier PA, and select one of a plurality of switch ranges based on the estimated power range for use in the power amplifier PA.

The RF circuit 20 is configured to transmit an uplink signal to and receive a downlink signal from the air interface. The control circuit 22 is configured to perform various baseband signal processing and communication protocol processing procedures in the communication modem or communication CPU module. The baseband signal processing performed by the control circuit 22 includes determining the radio resource assigned to the communication device 2 by the network system and the signal quality of the environment. The memory 24 is configured to store program codes and data such as the operation system programs and user application programs, and collecting information on the times, locations or software used by the wireless module on the communication device 2, so that the control circuit 22 can analyze the PA gain switch ranges or the transmit power associated messages to adaptively adjust parameters for the power amplifier PA. The control circuit 22 and memory 24 are configured to provide external information functionalities and internal information functionalities for adjusting the PA gain switch ranges adaptively, so that the PA gain switch range of a power amplifier PA 200 can be optimized for the battery life based on user behavior or conditions of the wireless environment.

The RF circuit 20 includes the power amplifier PA 200 and an RF front-end circuit 202. The RF circuit 20 may further include a match circuit, various filters and wiring layouts (not shown). After the hardware architecture is determined, the communication device 2 can determine a set of PA gain switch ranges for the FR circuit 20 via the RF calibration procedure during the device startup or the factory test, thereby acquiring stable efficiency for the RF circuit 20. The power amplifier PA 200 includes two or more gain modes such as high, intermediate and low-gain modes. Each gain mode has two or more gain switch ranges controlled and selected by the control circuit 22. For example, the low-gain mode has two gain switch ranges, one providing an increased transmit power headroom for the power amplifier, and the other preventing a power amplifier from consuming excessive power. In some embodiments, the power amplifier PA 200 can receive a gain control signal from the control circuit 22 to select one of a plurality of gain modes for amplifying the power of the uplink signal and driving the amplified uplink signal to a receiver, base station, or a network system.

The control circuit 22 includes a controller 220, a communication protocol module 222 and external information module 224, configured to process all data and information associated with the environment external to the communication device 2. The control circuit 22 is configured to compute the transmit power of the uplink signal according to the processed data and information, and determine the PA gain switch range based on the computed transmit power for the uplink signal. The information or data associated with external environment include the network resource assignment and the wireless channel environment. The network system can assign limited radio resources including Radio Resource Management (RRM), Transmit Power Control (TPC), and Quality of Service (QoS) to the wireless communication devices in the coverage. The control circuit 22 can compute a transmit power for the uplink signal based on the assigned radio resources. For example, the network system can assign a plurality of carriers, certain transmit powers, and a real-time QoS to the communication device 2. The communication protocol module 222 is configured to interpret the system information sent from the network system to acquire the information on the assigned carriers, the transmit power and the QoS. Then the controller 220 is configured to compute the transmit power of the uplink signal and the distribution of the transmit powers of the uplink signals based on the acquired information on the assigned carriers, the transmit power and the QoS. In some embodiments, the communication protocol module 222 can communicate with the network system with a shared communication protocol, thereby, adjusting the PA gain switch mode to increase the battery life. Moreover, since the network system adopts various types of base stations, including macrocells, microcells, picocells, femtocells or other types of cells and various types of service versions, the signal interferences in the radio channel can vary with user environment. Accordingly, the external information module 224 in the control circuit 22 is configured to compute the PA gain switch range and the radio channel estimation to compute a Signal to Interference and Noise Ratio (SINR), so that the controller 220 can determine the transmit power of the uplink signal and the distribution of the transmit powers of the uplink signals based on the computed SINR. Finally, the controller 220 is configured to determine the gain switch range of the power amplifier PA 200 according to the determined distribution of the transmit powers of the uplink signals, and determine one PA gain mode according to the determined gain switch range and the transmit power of the uplink signal, and pass the determined PA gain mode to the power amplifier PA 200 by a gain control signal, thereby amplifying the power for the uplink signal. For example, when the transmit power of the uplink signal exceeds an upper switch point of the gain switch range, the controller 220 is configured to switch the power amplifier PA 200 to an increased level of the gain modes. Whereas, when the transmit power of the uplink signal is less than a lower switch point of the gain switch range, the controller 220 is configured to switch the power amplifier PA 200 to a decreased level of the gain modes. When the transmit power of the uplink signal is within the upper switch point and the lower switch point of the gain switch range, the controller 220 is configured to remain in a current gain mode. The communication protocol module 222 and the external information module 224 may be a digital circuit (e.g., digital signal processor, DSP) or a memory with an associated driving program. The distribution of the transmit power of the uplink signal and the corresponding gain switch range can be recorded in a lookup table in a memory device in the control circuit 22 or in other locations.

The memory 24 includes a user application program 240 and internal information program 242, configured to process data associated with the internal data of the communication device 2. A processor or controller (not shown) can access the program codes in the user application program 240 or the internal information program 242 and execute the program codes, accordingly. In some embodiments, the controller 220 in the control circuit 22 can access the user application program 240 or the internal information program 242, collect the information on the times, locations and associated software used on the communication device 2, analyze the PA gain switch ranges or transmit power associated messages and accordingly adapt the parameters for the power amplifier PA 200. For example, the user can specify an upload speed, a bandwidth limit or a data stream limit for a certain time, location, network service or software, then the controller 220 can estimate the transmit power of the uplink signal and the distribution of the transmit powers of the uplink signals according to the specified upload speed, the bandwidth limit or the data stream limit, thereby determining a gain switch range for the power amplifier PA 200 based on the estimated the transmit power of the uplink signal and the distribution of the transmit powers of the uplink signals. The controller 220 can access the internal information program 242 from the memory 24 to analyze the information on the times, locations, associated services and software, to derive a statistical measure, thereby acquiring the corresponding gain switch range. When the communication device 2 requests for a network service later, the internal information program 242 can determine a corresponding gain switch range for use in the controller 220 based on the analyzed information. The controller 220 is configured to determine a PA gain mode based on the corresponding gain switch range and the transmit power of the uplink signal, and send the gain determined by the PA gain mode via the gain control signal to the power amplifier PA 200, amplifying the power of the uplink signal. The distribution of the transmit power of the uplink signal and the corresponding gain switch range can be recorded in a lookup table in the memory 24 or in memory at other locations.

Figure 3A:
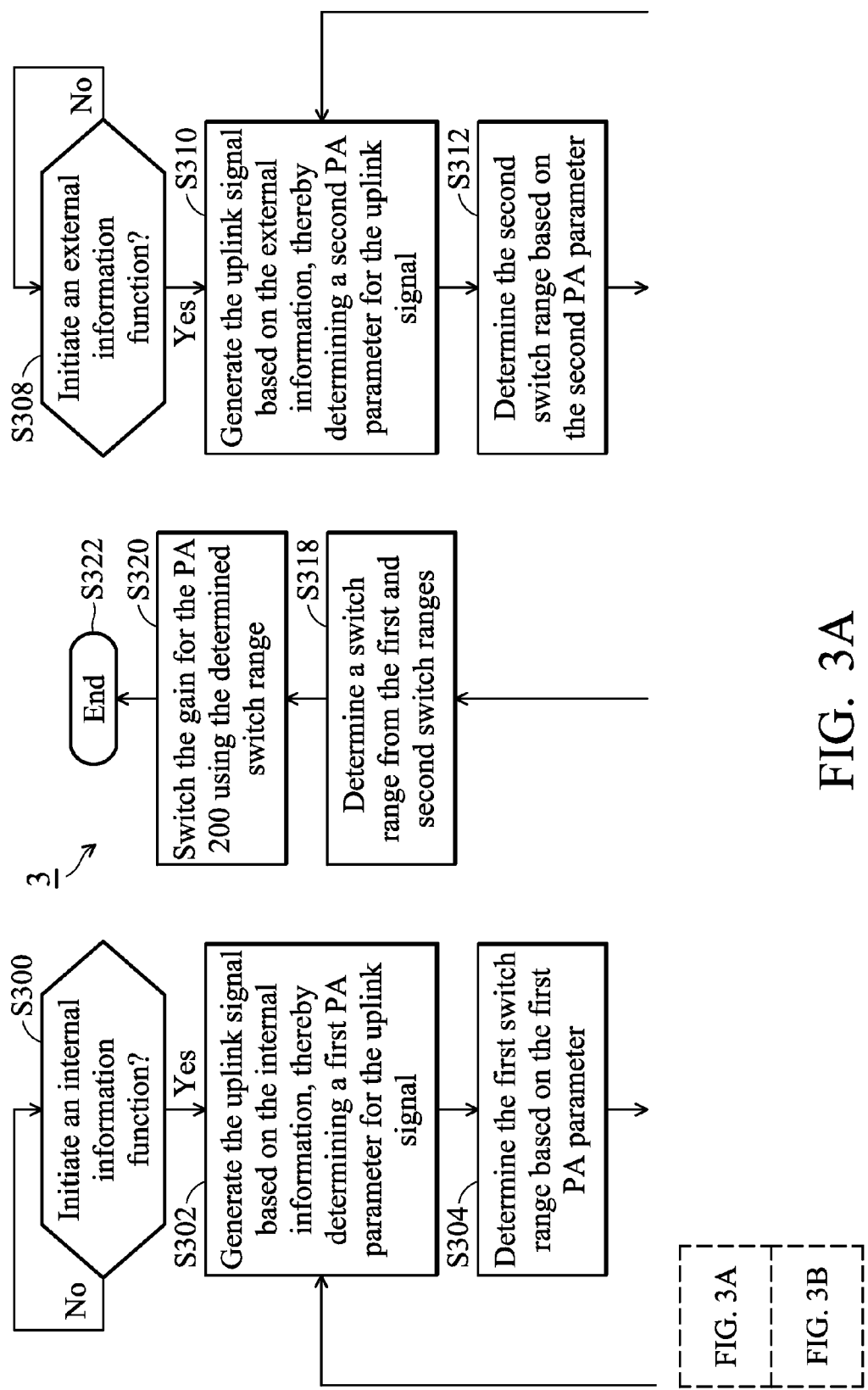
FIGS. 3A and 3B are a flowchart of a switch method 3 switching gain modes for a power amplifier.
Figure 3B:
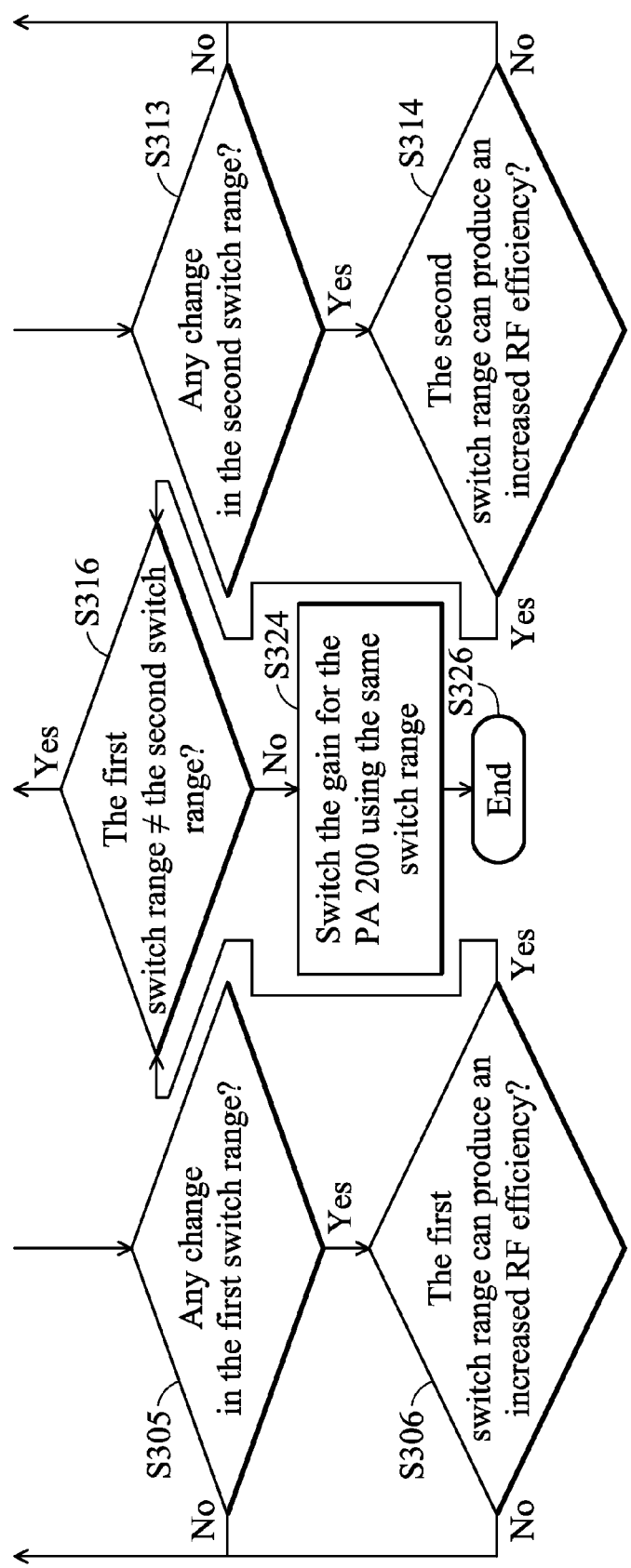

FIGS. 3A and 3B are a flowchart of a switch method 3 switching gain modes for a power amplifier, incorporating the communication device 2 in FIG. 2.

After the communication device 2 is initialized, it can determine a gain switch range according to the internal information functionalities associated with user behavior or demands and the external information functionalities. Regarding the internal information functionalities, the controller 220 is configured to check whether an option for the internal information functionalities has been activated (S300). If the option has not been activated, the controller 220 is configured to regularly or continuously determine the status of the option for the internal information functionalities (S300).

Figure 4:
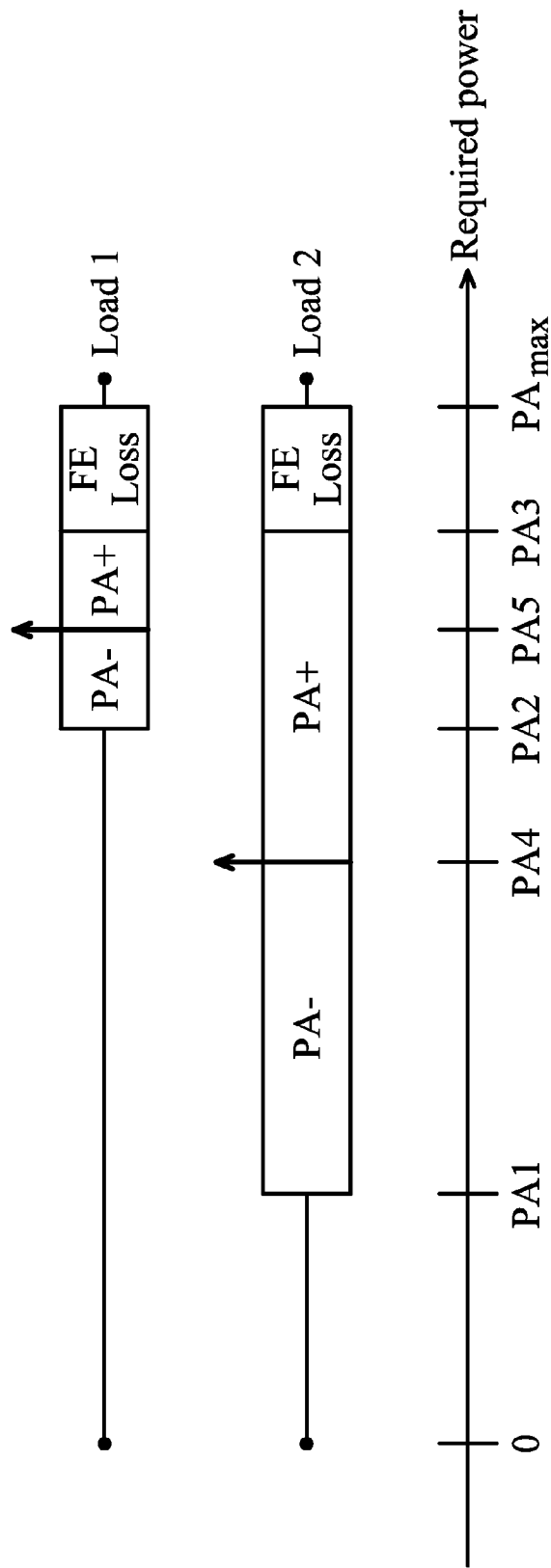
FIG. 4 illustrates a distribution of the PA parameters of the power amplifier according to an embodiment of the disclosure.

If the option has been activated, the controller 220 is configured to produce the uplink signal based on the internal information, and determine a PA parameter representing the distribution of the transmit powers of the uplink signals (S302). The controller 220 can execute the user application program 240 and the internal information program 242 to generate the internal information. For example, the user application program 240 may be used to retrieve the internal information input by the user, such as the upload speed, the bandwidth limit or the data stream limit, and the controller 220 is configured to concurrently generate one or more digital output data according tot the input internal information, and sum all of the digital output data together to compute the first PA parameter. The first PA parameter may be a sum of all powers of the digital output data, or the value of the sum of the powers converted in dBm or in a quantization unit. After a period of data collection expired, the controller 220 can establish a distribution of the first PA parameters representing the distribution of the transmit powers of the uplink signals. FIG. 4 illustrates a distribution of the PA parameters of the power amplifier according to an embodiment of the disclosure, including two uplink signals designated by load 1 and load 2 in dBm. As illustrated, the distribution of the PA parameter directly corresponds to the distribution of the required transmit powers of the uplink signals. Each uplink signal includes a parameter range PA−, an average, a parameter range PA+ and a front-end loss potion (FE loss). The parameter range PA− covers a range from the lower limit of the PA parameters to the average of the PA parameters, and the parameter range PA+ covers a range from the average of the PA parameters to the upper limit of the PA parameters. The FE loss is the power consumption in the RF circuit 20 including the RF front-end circuit 202.

After producing a distribution of the PA parameters as illustrated in FIG. 4, the controller 220 is configured to determine a low-gain switch range based on the distribution of the PA parameters (S304). For example, when the first PA parameters are the distribution of the load 1 in FIG. 4, since the distribution of the PA parameters is across a small range of the powers PA2-PA3, the controller 220 can select the gain switch range S2 in FIG. 1 as the low-gain switch range, so that the power amplifier PA 200 has an increased time operating in the low-gain mode, in comparison to other gain switch ranges. When the first PA parameters are the distribution of the load 2, as illustrated in FIG. 4, since the distribution of the PA parameters is across a large range of the powers PA1-PA3, the controller 220 can select the gain switch range S1 in FIG. 1 as the low-gain switch range, so that the power amplifier PA 200 has an increased time operating in the high-gain mode, in comparison to other gain switch ranges. In other embodiments, the controller 220 is configured to determine the low-gain switch range according to the distribution of the PA+ parameters. With reduced distribution of the PA+ parameters, the controller 220 is configured to determine the low-gain switch range that has an increased time operating the power amplifier PA 200 under a lower gain mode. Conversely, with increased distribution of the PA+ parameters, the controller 220 is configured to determine the low-gain switch range that has an increased time operating the power amplifier PA 200 under a higher gain mode.

Referring again to FIG. 3, the controller 220 can next determine whether the determined low-gain switch range is different from the previous low-gain switch range (S305). If the two low-gain switch ranges are identical, the switch method 3 is configured to return to performing Step S302 for re-computing the PA parameters for the uplink signals. If the two low-gain switch ranges are different, the switch method 3 is configured to evaluate whether the newly determined low-gain switch range would degrade the RF efficiency of the power amplifier PA 200 (S306). The controller 220 is configured to compute an Adjacent Channel Leakage Power Rate (ACLR), Error Vector Magnitude (EVM), transmit powers, SNR or QoS parameters for the amplified uplink signals, thereby evaluating the present RF efficiency of the power amplifier PA 200. When the determined low-gain switch range causes unstable network connection or unsatisfactory QoS for RF efficiency, the controller 220 is configured to retain the previous low-gain switch range and the switch method 3 is configured to go back to Step S302 for re-computing the PA parameters. When the determined low-gain switch range renders satisfactory RF efficiency, the switch method 3 is configured to perform Step S316. Step S306 is an optional step. In some embodiments, the switch method 3 can perform Step 316 without performing Step S306.

Regarding the external information functionalities, the controller 220 is configured to check whether an option for the external information functionalities has been activated (S300). If the option has not been activated, the controller 220 is configured to regularly or continuously determine the status of the option for the external information functionalities (S308).

If the option has been activated, the controller 220 is configured to produce the uplink signal based on the external information, and determine a PA parameter representing the distribution of the transmit powers of the uplink signals (S310). The external information may be generated by the controller 220, the communication protocol module 222 or the external information module 224. For example, the communication protocol module 222 may be used to retrieve the system information sent from the network system to acquire information on the number of carriers, the assigned transmit power and the quality of service. The external information module 224 is configured to compute the SINR parameter in the radio channel according to the received downlink signal. Next, the controller 220 can estimate one or more digital output data based on the external information such as the number of carriers, the assigned transmit power, the quality of service, the SINR or other external information, and sum all of the digital output data together to compute the second PA parameter. The second PA parameter may be a sum of all powers of the digital output data, or the value of the sum of the powers converted in dBm or in a quantization unit. After a period of data collection, the controller 220 can acquire a distribution of the second PA parameters representing the distribution of the transmit powers of the uplink signals. FIG. 4 illustrates a distribution of the PA parameters of the power amplifier according to an embodiment of the disclosure, including two uplink signals designated by load 1 and load 2 in dBm. As illustrated, the distribution of the PA parameter directly corresponds to the distribution of the required transmit powers of the uplink signals. Each uplink signal includes a parameter range PA−, an average, a parameter range PA+ and a front-end loss potion (FE loss). The parameter range PA− covers a range from the lower limit of the PA parameters to the average of the PA parameters, and the parameter range PA+ covers a range from the average of the PA parameters to the upper limit of the PA parameters. The FE loss is the power consumption in the RF circuit 20 including the RF front-end circuit 202.

After producing a distribution of the PA parameters as illustrated in FIG. 4, the controller 220 is configured to determine a high-gain switch range based on the distribution of the PA parameters (S312). For example, when the first PA parameters are the distribution of the load 1 as illustrated in FIG. 4, since the distribution of the PA parameters is across a small range of the powers PA2-PA3, the controller 220 can select the gain switch range S2 in FIG. 1 as the high-gain switch range, so that the power amplifier PA 200 has an increased time operating in the low-gain mode, in comparison to other gain switch ranges. When the second PA parameters are the distribution of the load 2 as illustrated in FIG. 4, since the distribution of the PA parameters is across a large range of the powers PA1-PA3, the controller 220 can select the gain switch range S1 in FIG. 1 as the high-gain switch range, so that the power amplifier PA 200 has an increased time operating in the high-gain mode, in comparison to other gain switch ranges. In other embodiments, the controller 220 is configured to determine the high-gain switch range according to the distribution of the PA+ parameters. With less distribution of the PA+ parameters, the controller 220 is configured to determine the high-gain switch range that has an increased time operating the power amplifier PA 200 under a lower gain mode. Conversely, with increased distribution of the PA+ parameters, the controller 220 is configured to determine the high-gain switch range that has an increased time operating the power amplifier PA 200 under a higher gain mode.

Next, the controller 220 can determine whether the determined high-gain switch range is different from the previous high-gain switch range (S313). If the two high-gain switch ranges are identical, the switch method 3 is configured to return to performing Step S310 for re-computing the PA parameters for the uplink signals. If the two high-gain switch ranges are different, the switch method 3 is configured to evaluate whether the newly determined high-gain switch range would result in degradation of the RF efficiency for the power amplifier PA 200 (S314). Step S314 is an optional step. In some embodiments, the switch method 3 can perform Step 316 directly without performing Step S314. The controller 220 is configured to compute an ACLR, EVM, transmit powers, SNR or QoS parameters for the amplified uplink signals, thereby evaluating the present RF efficiency of the power amplifier PA 200. When the determined high-gain switch range causes unstable network connection or unsatisfactory QoS variation in the RF efficiency, the controller 220 is configured to retain the previous high-gain switch range and the switch method 3 is configured to again perform Step S310 for re-computing the PA parameters. When the determined high-gain switch range renders a satisfactory RF efficiency, the switch method 3 is configured to perform Step S316.

Since the switch method 3 deploys the internal information functionalities or the external information functionalities to determine the gain switch range, there could be 4 possible conditions, i.e., the internal information functionalities is activated while the external information functionalities is inactivated, the internal information functionalities is inactivated while the external information functionalities is activated, both the internal and external information functionalities are activated, or both the internal and external information functionalities are inactivated. In the condition where both the internal and external information functionalities are activated a confliction may arise between the gain switch ranges determined by the internal and external information. Thus, the switch method 3 performs Steps S316 through S320 to determine the gain switch range to be adopted by the power amplifier PA 200. In Step S316, the controller 220 is configured to compare the first and high-gain switch ranges. When the two gain switch ranges are the same, the controller 220 is configured to employ the same gain switch range and the required power of the uplink signal to determine a gain mode for the power amplifier PA 200 (S324), and then the switch method 3 is completed and exited (S326). When the first and high-gain switch ranges are different, the controller 220 is configured to select one of the first and high-gain switch ranges as the gain switch range to be adopted by the power amplifier PA 200 (S318). In some embodiments, the controller 220 is configured to assign a first priority and a second priority to the internal information functionalities and the external information functionalities respectively, and the first and second priorities are different. The controller 220 is configured to determine which one of the first and high-gain switch ranges is to be used as the adopted gain switch range. For example, the controller 220 can assign a higher priority to the internal information functionalities than to the external information functionalities. When the low-gain switch range is different from the second one, the controller 220 will select the low-gain switch range which corresponds to the internal information functionalities as the gain switch range to be used. In other embodiments, the controller 220 can determine a gain switch range corresponding to a smaller or reduced distribution of the PA parameters (the reduced power range of the transmit power) in the two distributions of the PA parameters (the first and second power ranges) as the gain switch range to be adopted, increasing the battery life of the communication device 2. In yet other embodiments, the controller 220 can determine a gain switch range corresponding to a larger or increased distribution of the PA parameters (the increased power range of the transmit power) in the two distributions of the PA parameters (the first and second power ranges) as the gain switch range to be adopted, increasing the signal quality of the uplink transmission for the communication device 2. Then the controller 220 can adopt the determined gain switch range and the required power of the uplink signal to determine the gain mode for the power amplifier PA 200 (S324). At this point the switch method 3 is completed and exited (S326).

The switch method 3 utilizes a plurality of gain switch ranges between two gain modes, allowing the communication device 2 to select an appropriate switch range for use by the power amplifier, rendering both the battery life and the signal quality of the uplink transmission improved.

Figure 5:
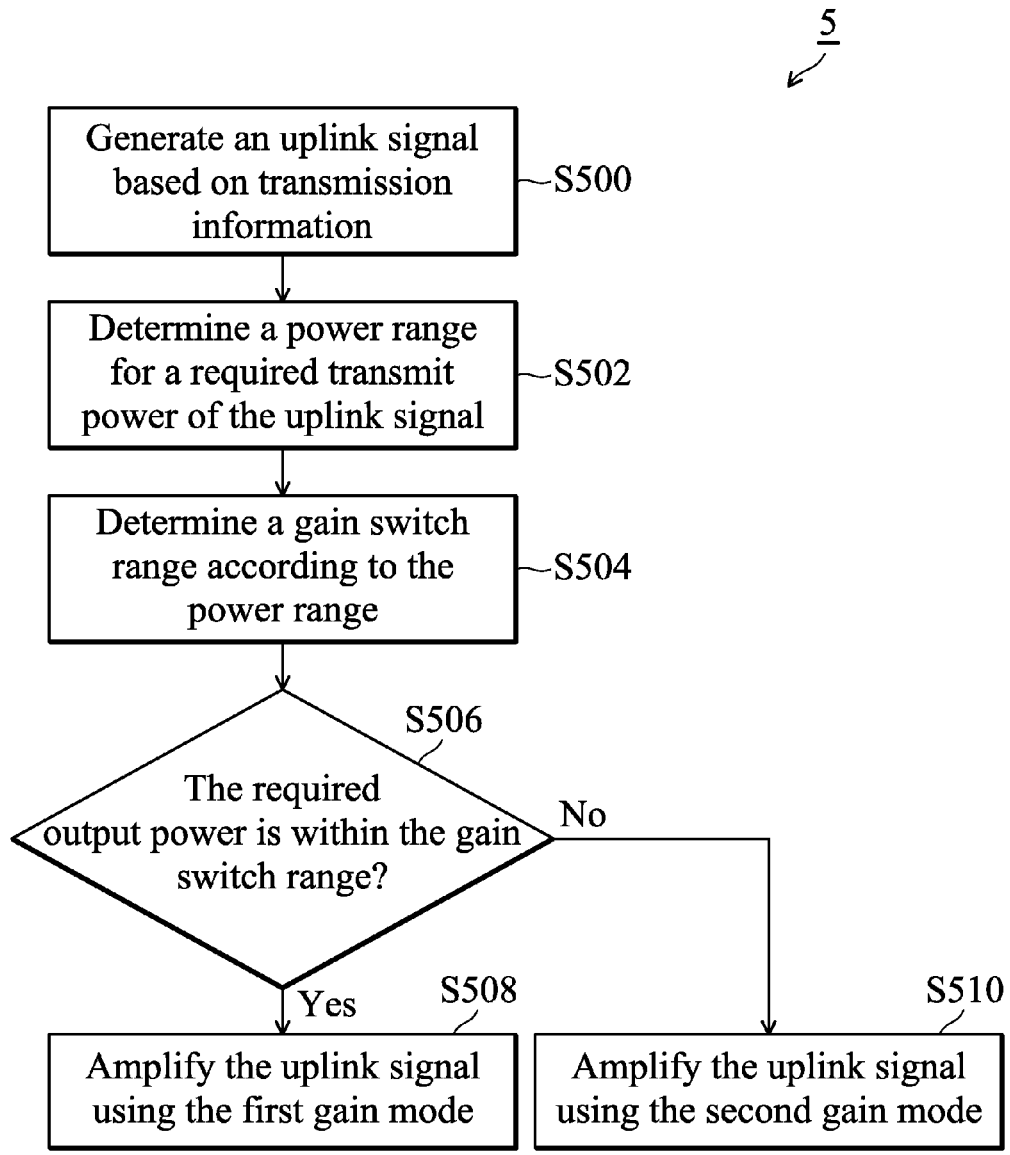
FIG. 5 is a flowchart of another switch method 5 switching gain modes for a power amplifier.

FIG. 5 is a flowchart of another switch method 5 switching gain modes for a power amplifier, incorporating the communication device 2 in FIG. 2.

After the communication device 2 is initialized, it can generate the uplink signal according to the transmission information (S500). The transmission information includes the internal information or the external information. The internal information may be the upload speed, the bandwidth limit, the data stream limit and other internal information configured by the communication device 2. The internal information may be the information on the number of carriers, the assigned transmit power, the quality of service, and other information regarding the external environment of the communication device 2. Next, after a period of data analysis for transmit powers of the uplink signals, the controller 220 can determine the power range of the required powers for the uplink signals (S502), and determine the gain switch range based on the power range (S504). Referring now to FIG. 4 and FIG. 1, when the power range of the required power is the load 1 as illustrated in FIG. 4, the controller 220 can select the gain switch range S2 in FIG. 1 as the gain switch range. The communication device 2 can determine whether the transmit power of the uplink signal is within the gain switch range, i.e., whether the transmit power of the uplink signal is between the upper limit and lower limit of the gain switch range. Taking FIG. 1 as an example, when the gain switch range S2 is selected, the communication device 2 can determine whether the transmit power of the uplink signal is between the powers P5 and P6. If so, the communication device 2 can amplify the uplink signal with the first gain mode (S508). In the example of selecting the gain switch range S2 as illustrated in FIG. 1, when the transmit power of the uplink signal is out of the gain switch range, i.e., the transmit power of the uplink signal is less than the power P5 or exceeds the power P6, the communication device 2 can amplify the uplink signal with the second gain mode (S510). The first gain mode is different from the second gain mode, wherein the first gain mode is a default value loaded by the communication device 2 during circuit initialization or the last value adopted by the communication device 2. When the transmit power of the uplink signal is less than the power P5, the second gain mode is lower than the first gain mode. Whereas when the transmit power of the uplink signal exceeds the power P6, the second gain mode is higher than the first gain mode.

The switch method 5 utilizes a plurality of gain switch ranges between two gain modes, allowing the communication device 2 to select an appropriate switch range for use by the power amplifier, rendering both the battery life and the signal quality of the uplink transmission improved.

Figure 6:
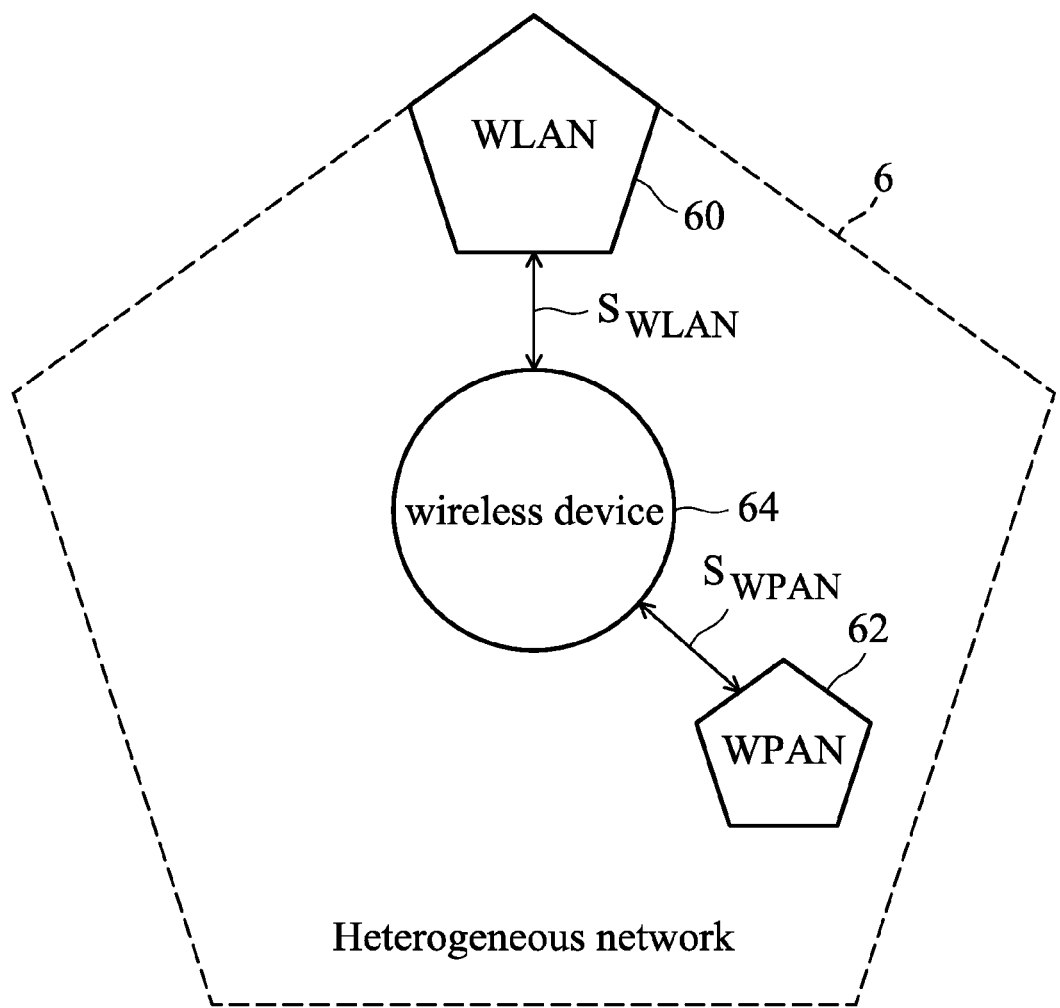
FIG. 6 is a schematic diagram of a heterogeneous network 6 according to an embodiment of the disclosure.

FIG. 6 is a schematic diagram of a heterogeneous network 6 according to an embodiment of the disclosure, including a wireless local area network (WLAN) 60 and a wireless personal area network (WPAN) 62. A wireless device 64 (mobile device) may roam between the networks 60 and 62 and communicate with the network 60 or 62 with a radio frequency (RF) signal $S_{WLAN}$ or $S_{WPAN}$, respectively.

The heterogeneous network 6 may be a software-defined network which contains the WLAN 60 and the WPLAN 62. The WLAN 60 covers a local area such as a home, school, laboratory, office building, or retail store, whereas the WPLAN 62 covers data transmission among devices such as computers, telephones, and personal electronic devices equipped with wireless communication abilities. Because radio coverage ranges of the WLAN 60 and WPLAN 62 differ in a great scale, the wireless device 64 may communicate with the WLAN 60 and WPLAN 62 with different transmit power ranges. Consequently, the wireless device 64 may dynamically and actively adopt a gain switch points or gain switch range according to transmit power control information to generate the outgoing signals $S_{WLAN}$ or $S_{WPAN}$. The transmit power control information may be the radio coverage range of the connected network or a maximum allowable transmit power in the connected network. Further, the transmit power control information may include, and is not limited to, Radio Resource Management (RRM), Transmit Power Control (TPC), and Quality of Service (QoS), or a network type of the wireless communication network.

Figure 7:
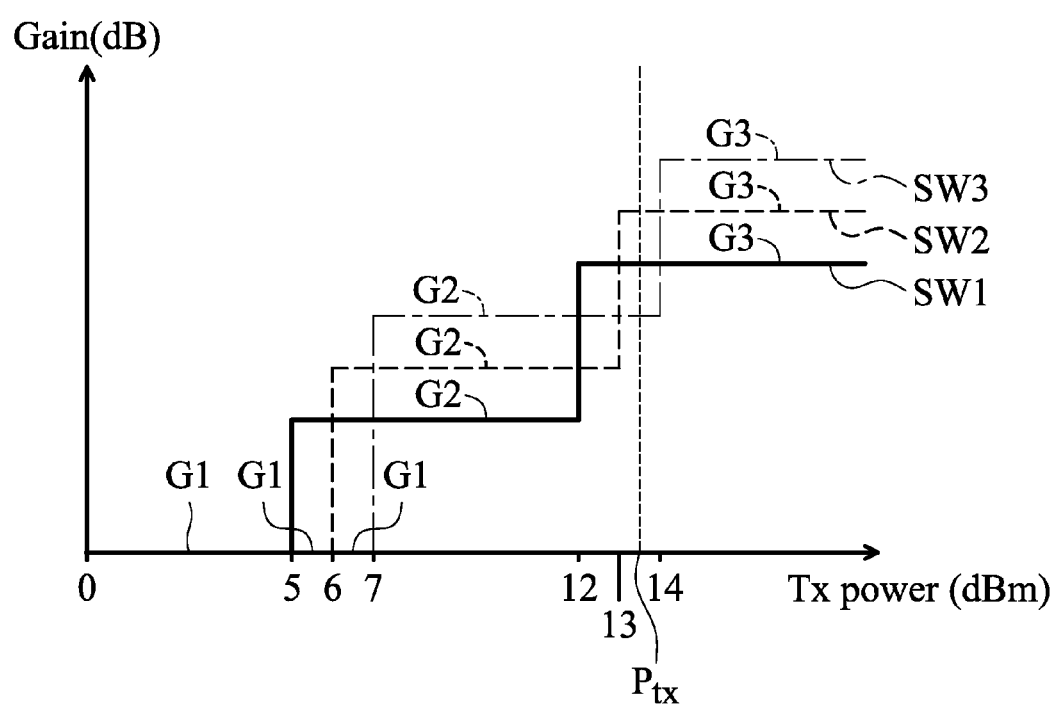
FIG. 7 shows a relationship chart of a power gain against a transmission power required by a power amplifier according to an embodiment of the disclosure.

For example, when the wireless device 64 moves into the WLAN 60 and establishes a wireless connection thereto, it may identify the radio coverage range according to the network type of the WLAN 60, determine a high-gain switch range based on the radio coverage range of the network type of the WLAN 60, and generate the outgoing signal $S_{WLAN}$ with a power gain determined by the high-gain switch range; as the wireless device 64 switches from the WLAN 60 to the WPAN 62, it may establish another wireless connection to the WPAN 62, identify the radio coverage range according to the network type of the WPAN 62, determine a low-gain switch range based on the radio coverage range of the network type of the WPAN 62, and generate the outgoing signal $S_{WPAN}$ with a power gain determined by the low-gain switch range. Because the WLAN 60 has a larger radio coverage range than that of the WPAN 62, the high-gain switch range may cover a lower power range than that of the low-gain switch range, so that the wireless device 64 may switch to a higher gain earlier by using the high-gain switch range than the low-gain switch range. FIG. 7 details the operation of different gain switch ranges. By selecting the gain switch range based on the radio coverage range of the network type, the wireless device 64 may use less transmit power to transmit the RF signals in the communication network with a smaller radio coverage range, and use more transmit power to transmit the RF signals in the communication network with a larger radio coverage range, thereby reducing power consumption and extending battery life, while supplying sufficient transmit power for transmitting the RF signals in the communication network.

In another example, the wireless device 64 may determine the gain switch range based on the maximum allowable transmit power. After the wireless device 64 establishes a wireless connection to a wireless communication network such as the WLAN 60, it may receive a maximum allowable transmit power such as a transmit power control (TPC) command from the wireless communication network. The maximum allowable transmit power is assigned by the WLAN 60 to the wireless device 64 to prevent too much unwanted interference between different wireless communication networks or different wireless devices. Therefore, the wireless device 64 may determine the gain switch range according to the maximum allowable transmit power. Specifically, when the maximum allowable transmit power is large, the wireless device 64 may use a high-gain switch range to control the power gain of the WLAN signal $S_{WLAN}$; when the maximum allowable transmit power is lower, the wireless device 64 may use a low-gain switch range to control the power gain of the WLAN signal $S_{WLAN}$. Accordingly, the high-gain switch range may cover a lower power range than that of the low-gain switch range. Consequently, when the maximum allowable transmit power is large, the wireless device 64 may switch to a higher gain earlier by using the high-gain switch range than using the low-gain switch range to deliver the larger transmit power to the WLAN signal $S_{WLAN}$. Conversely, when the maximum allowable transmit power is lower, the wireless device 64 may switch to a higher gain later by using the low-gain switch range than using the high-gain switch range to deliver the lower transmit power to the WLAN signal $S_{WLAN}$. Please refer FIG. 7 for the details of the operations of different gain switch ranges. By selecting the gain switch range based on the maximum allowable transmit power, the wireless device 64 may use less transmit power to transmit the RF signals for a smaller maximum allowable transmit power, and use more transmit power to transmit the RF signals for a larger maximum allowable transmit power, thereby reducing power consumption and extending battery life, while supplying a sufficient transmit power to meet the maximum allowable transmit power.

Briefly, the wireless device 64 adapts the gain switch range according to the transmit power control information for generating the RF signal to be transmitted in the heterogeneous network 6, reducing power consumption and extending battery life, while supplying a sufficient transmit power to meet the power requirement in the heterogeneous network 6.

FIG. 7 shows a relationship of a power gain against a transmission power required by a power amplifier according to an embodiment of the disclosure, including a high-gain switch range SW1, a mid-gain switch range SW2, and a low-gain switch range SW3, each gain switch range contains 3 gain modes, namely gains G1, G2, and G3. Accordingly, the wireless device 64 in FIG. 6 may select one gain switch range from the high-gain switch range SW1, the mid-gain switch range SW2, and the low-gain switch range SW3.

When the high-gain switch range SW1 is selected, the wireless device 64 may generate an RF signal using the gain G1 for a transmission power less than 5 dBm, using the gain G2 for the transmission power between 5 and 12 dBm, and using the gain G3 for the transmission power exceeding 12 dBm. When the mid-gain switch range SW2 is selected, the wireless device 64 may generate the outgoing RF signal using the gain G1 for the transmission power less than 6 dBm, using the gain G2 for the transmission power between 6 and 13 dBm, and using the gain G3 for the transmission power exceeding 13 dBm. When the low-gain switch range SW3 is selected, the wireless device 64 may generate the outgoing RF signal using the gain G1 for the transmission power less than 7 dBm, using the gain G2 for the transmission power between 7 and 14 dBm, and using the gain G3 for the transmission power exceeding 14 dBm.

It can be seen in FIG. 7 that the high-gain switch range SW1 switches to a higher gain earlier than the mid-gain switch range SW2 and the low-gain switch range SW3, consequently the wireless device 64 will consume more power to transmit the RF signal by adopting the high-gain switch range SW1 instead of the mid-gain switch range SW2 and the low-gain switch range SW3. For example, when the wireless device 64 requires a transmit power (Tx power) of 13.5 dBm to transmit the RF signal, it will select the gain G2 to generate the RF signal if the low-gain switch range SW3 is adopted, and the gain G3 if the mid-gain switch range SW2 or the high-gain switch range SW1 is adopted. In certain implementation, different gains are implemented by different numbers of amplifiers or transistors, and a higher gain is usually realized by an increased number of amplifiers or transistors, e.g., the gain G1 is realized by 1 amplifier, the gain G2 is realized by 2 amplifiers, and the gain G3 is realized by 3 amplifiers. The higher gain is provided by activating the increased number of amplifiers or transistors and consequently in the present example, an increased amount of power is consumed by the wireless device 64 to generate the RF signal when the mid-gain switch range SW2 or the high-gain switch range SW1 is adopted.

Figure 8:
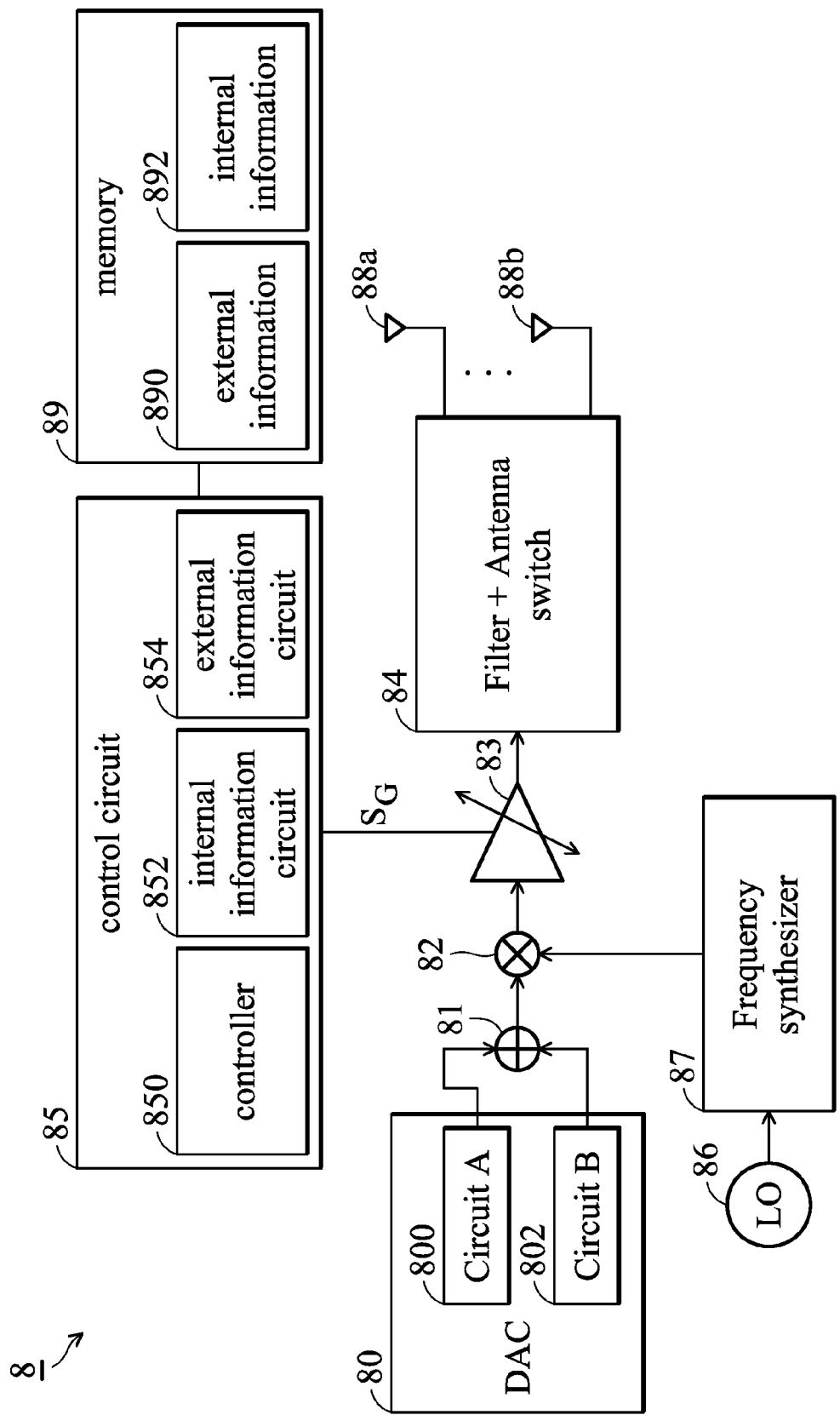
FIG. 8 is a block diagram of a mobile device 8 according to an embodiment of the disclosure.

FIG. 8 is a block diagram of a mobile device 8 according to an embodiment of the disclosure, including a digital-to-analog converter (DAC) 80, an adder 81, a mixer 82, a programmable gain amplifier (PGA) 83, a filter and antenna switch 84, a control circuit 85, a local oscillator (LO) 86, a frequency synthesizer 87, antennas 88*a* and 88*b* and a memory device 89. The mobile device 8 may serve as the wireless device 64 in FIG. 6.

The mobile device 8 may transmit two or more RF signals over two or more continuous communication channels to a communication network. The two or more continuous channels are frequency-continuous to one another, so that the common PGA 83 may amplify two or more analog signals from circuit A 800, circuit B 802, and other circuits (not shown) in the DAC 80 to generate the two or more frequency-adjacent RF signals for transmission.

Since the two or more RF signals are amplified by the common PGA 83 and each RF signal may correspond to specific external information (transmit power control information) and/or a specific internal information, the mobile device 8 may dynamically determine an amplifier gain switch range according to the external information and/or the internal information for the two or more RF signals, and use the gain switch range to determine a gain to generate and transmit the two or more RF signals over the two or more continuous channels to the communication network.

The external information is sent from the wireless communication network, and may include, and is not limited to, Radio Resource Management (RRM), Transmit Power Control (TPC), and Quality of Service (QoS), or a network type of the wireless communication network. The internal information may include, but not limited to, an attachment status, properties of an application, a transmission behavior of the transmitted data, and a user behavior, and an operating mode such as a transport data mode, a control data mode, an active mode, an inactive mode, a weekday mode, a holiday mode, an energy-saving mode, a performance oriented mode, and a balanced mode. The attachment status may be an attached status or a detached status of the mobile device 8, indicating the mobile device 8 is hung up in the inactive mode or picked up in the active mode. The properties of the application may be a data rate or a service type of the application. The transmission behavior of the transmitted data may be a data rate of a data type such as the transport data and the control data. The user behavior may include an application or a communication network that a user of the mobile device 8 used in the past during different periods of time, e.g., weekdays, weekend, holidays, daytime, or nighttime.

The DAC 80 contains the circuit A 800, circuit B 802, and other circuits (not shown), and receives baseband data for different applications or data types from a baseband circuit (not shown) to output the two or more analog signals on adjacent frequency bands. Specifically, the circuit A 800 and the circuit B 802 convert data into analog signals for different applications or different data types.

The adder 81 combines the two or more analog signals to output a combined signal with the two or more analog signals on different frequency bands, then the mixer 82 up-converts the combined signal by a center carrier frequency generated by the frequency synthesizer 87, which generates the center carrier frequency by an oscillation signal output from the LO 86. The up-converted signal is amplified by the PGA 83 with a gain selected by a gain signal $S_G$ from the control circuit 85.

The control circuit 85 includes a controller 850, an internal information circuit 852, and an external information circuit 854, and may determine the amplifier gain of the PGA 83 according to external information 890 and internal information 892 stored in the memory device 89.

The internal information circuit 852 may determine an output power range of the PGA 83 according to the internal information 892 of the mobile device. The internal information 892 may include, but is not limited to, the transmission behavior of the transmitted data, the attachment status, the properties of the applications, and the user behavior, the transport data mode, and an operating mode such as the control data mode, the active mode, the inactive mode, the weekday mode, the holiday mode, the energy-saving mode, the performance oriented mode, and the balanced mode.

In one embodiment, the internal information 892 may be the transmission behavior of the transmitted data, wherein the transmitted data may be transport data or control data, and the transmission behavior of the transport data may include a high throughput, while the transmission behavior of the control data may include a low throughput. In one example, the mobile device 8 may generate transport data A by the circuit A 800 and transport data B by the circuit B 802, and the internal information circuit 852 may determine the internal information 892 of the mobile device 8 as the performance oriented mode, and determine the output power range of the PGA 83 according to the performance oriented mode. The performance oriented mode is a power mode in which a large transmit power is required by the PGA 83 to generate the RF signals. In another example, the mobile device 8 may generate transport data A by the circuit A 800 and control data B by the circuit B 802, and the internal information circuit 852 may determine the internal information 892 of the mobile device 8 as the balanced mode, and determine the output power range of the PGA 83 according to the balanced mode. The balanced mode is a power mode in which a moderate transmit power is required by the PGA 83 to generate the RF signals. In yet another example, the mobile device 8 may generate control data A by the circuit A 800 and transport data B by the circuit B 802, and the internal information circuit 852 may determine the internal information 892 of the mobile device 8 as the balanced mode, and determine the output power range of the PGA 83 according to the balanced mode. In still another example, the mobile device 8 may generate control data A by the circuit A 800 and control data B by the circuit B 802, and the internal information circuit 852 may determine the internal information 892 of the mobile device 8 as the energy-saving mode, and determine the output power range of the PGA 83 according to the energy-saving mode. The energy-saving mode is a power mode in which a small transmit power is required by the PGA 83 to generate the RF signals.

When the internal information circuit 852 determines the internal information 892 as the performance oriented mode, a large transmit power will be required, thus the controller 850 may determine the high-gain switch range as the amplifier gain switch range of the PGA 83. When the internal information circuit 852 determines the internal information 892 as the energy-saving mode, a small transmit power will be required, thus the controller 850 may determine the low-gain switch range as the amplifier gain switch range of the PGA 83. When the internal information circuit 852 determines the internal information 892 as the balanced mode, a moderate transmit power will be required, thus the controller 850 may determine the mid-gain switch range as the amplifier gain switch range of the PGA 83. The high-gain switch range, the mid-gain switch range, and the low-gain switch range may be the high-gain switch range SW1 the mid-gain switch range SW2, and the low-gain switch range SW3 in FIG. 7, respectively. The low-gain switch range includes a first upper bound and a first lower bound, the mid-gain switch range includes a second upper bound and a second lower bound, and the high-gain switch range includes a third upper bound and a third lower bound. The third upper bound is less than the second upper bound, and subsequently less than the first upper bound; and the third lower bound is less than the second lower bound, and subsequently less than the first lower bound.

The controller 850 may then select a gain mode for configuring the gain of the PGA 83. For example, when the required transmit power of the RF signal is within the amplifier gain switch range, the controller 850 may select a first gain mode as the gain of the PGA 83; and when the required transmit power of the RF signal is outside of the amplifier gain switch range, select a second gain mode as the gain of the PGA 83. Please refer to FIG. 7, when the high-gain switch range SW1 is used, and the required transmit power is 8 dBm, the controller 850 may determine that the required transmit power is within the high-gain switch range SW1 and select gain G2 as the gain of the PGA 83; whereas when the required transmit power is 13.5 dBm, the controller 850 may determine that the required transmit power is outside of the high-gain switch range SW1 and select gain G3 as the gain of the PGA 83. The controller 850 may configure the gain of the PGA 83 via the gain signal $S_G$.

Turning back to FIG. 8, after the RF signal is generated by the PGA 83 with the selected amplifier gain, the filter and antenna switch 84 may select two or more antennas from the plurality of antennas 88a through 88b and transmit the RF signal via the selected antenna.

In some embodiments, the external information circuit 852 may determine the output power range of the PGA 83 according to the external information 892 (transmit power control information) and the controller 850 may determine the amplifier gain switch range according to the output power range. For example, the mobile device 8 may generate first data by the circuit A 800 to be transmitted to a WLAN network (not shown) and generate second data by the circuit B 802 to be transmitted to a WPLN network (not shown). The external information circuit 852 may determine the radio coverage range of the WLAN and WPAN network from the external information 890 in the memory device 89. As the WLAN covers a larger radio coverage range, and the WPAN covers a smaller radio coverage range, the external information circuit 852 may determine a larger output power range for the first data and a smaller output power range for the second data.

When the internal information circuit 852 determines that the first data has a larger output power range, the controller 850 may determine the high-gain switch range as the amplifier gain switch range of the PGA 83. When the internal information circuit 852 determines that the second data has a smaller output power range, thus the controller 850 may determine the low-gain switch range as the amplifier gain switch range of the PGA 83. The controller 850 may then select a gain mode for configuring the gain of the PGA 83 according to the previous examples.

In some embodiments, the internal information circuit 852 may determine the output power range of the PGA 83 according to the internal information 892, and the external information circuit 852 may determine the output power range of the PGA 83 according to the external information 890, and the controller 850 may then determine the gain switch range of the PGA 83 according to both the output power ranges determined by the internal information circuit 852 and the external information circuit 854, and select a gain mode for configuring the gain of the PGA 83 according to the previous examples. In generally, when a combined output power ranged determined by the output power ranges from the internal information circuit 852 and the external information circuit 854 is narrow, e.g., less than a power range threshold, the controller 850 may configure the lower gain switch range as the amplifier gain switch range of the PGA 83, whereas when the combined output power ranged determined by the output power ranges from the internal information circuit 852 and the external information circuit 854 is wide, e.g., exceeding the power range threshold, the controller 850 may configure the higher gain switch range as the amplifier gain switch range of the PGA 83.

The internal information circuit 852 and/or the external information circuit 854 in the control circuit 85 may be realized by software codes stored in the memory device 89 and executable by the controller 850 or hardware circuits performing the operations described in the preceding paragraphs.

The mobile device 8 utilizes the external information and/or the internal information for two or more RF signals to determine an output power range, determines an amplifier gain switch range of a power amplifier according to the output power range, and selects a gain for the power amplifier to amplify the two or more RF signals and transmit over two or more adjacent communication channels. The adaptive amplifier gain switch range of the mobile device 8 reduces power consumption and extends battery life, while supplying a sufficient transmit power to meet the power requirement for the two or more RF signals.

Figure 9:
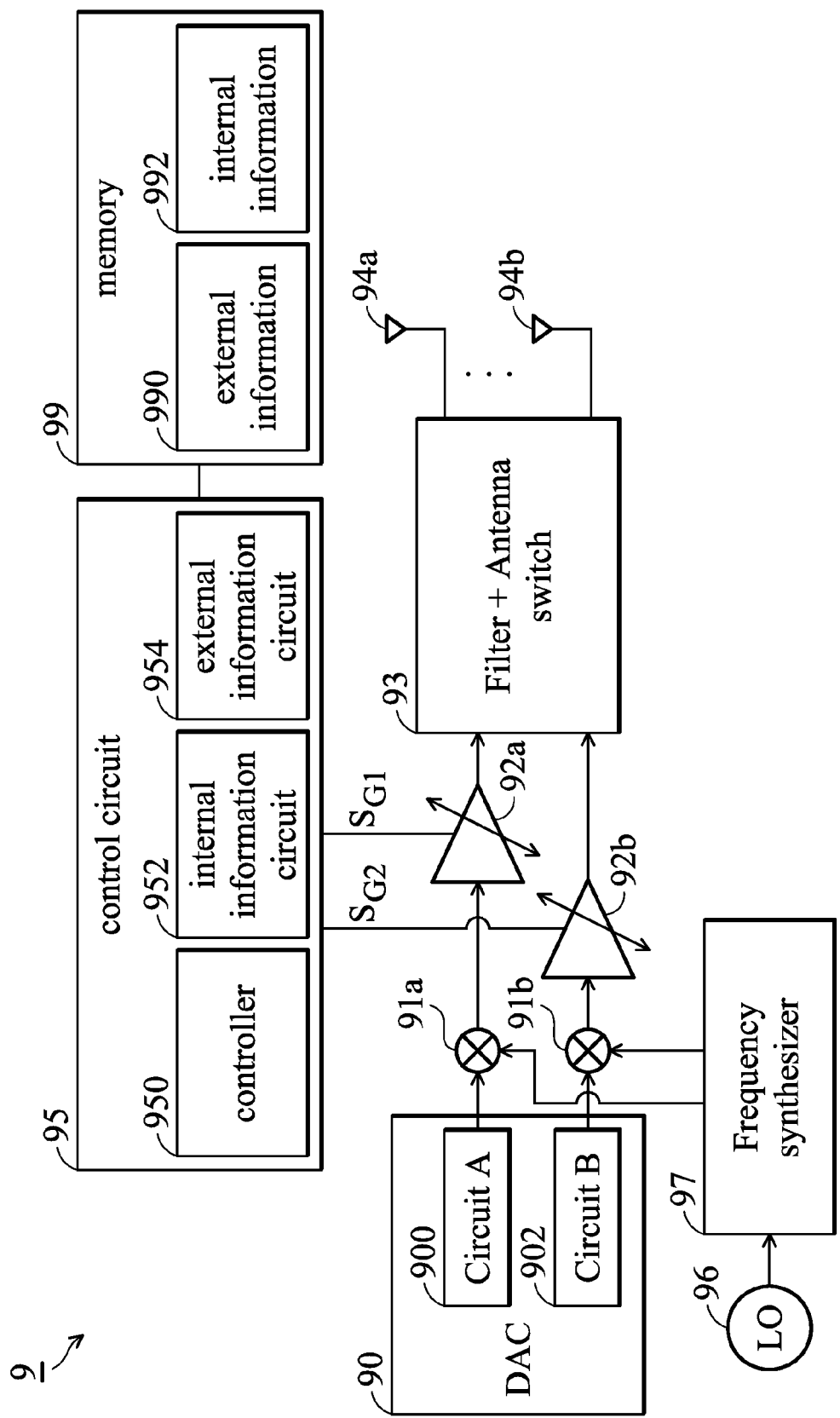
FIG. 9 is a block diagram of a mobile device 9 according to another embodiment of the disclosure.

FIG. 9 is a block diagram of a mobile device 9 according to another embodiment of the disclosure, including a BB circuit 90, mixers 91a, 91b, PGAs 92a, 92b, a filter and antenna switch 93, antennas 94a, 94b, a control circuit 95, a local oscillator (LO) 96, a frequency synthesizer 97, and a memory device 99. The mobile device 8 may serve as the wireless device 64 in FIG. 6. The mobile device 9 may serve as the wireless device 64 in FIG. 6.

The mobile device 8 may transmit two or more RF signals over two or more non-continuous communication channels to one or more communication networks. The two or more continuous channels are frequency-non-continuous to one another, so that the separate PGAs 92a and 92b may amplify two or more analog signals from circuit A 900 and circuit B 902 in the DAC 90, respectively, to generate the two or more frequency-non-continuous RF signals for transmission.

The configurations and operations of the control circuit 95 and the memory device 99 are identical to those in the control circuit 85 and the memory device 89 in FIG. 8, except that the control circuit 95 and the memory device 99 may determine the amplifier gain switch ranges and the gains for the PGAs 92a and 92b separately and independently according to the external information and/or the internal information of the two or more RF signals, thereby reducing power consumption and extending battery life, while supplying sufficient transmit powers to meet the power requirement for the two or more frequency-non-continuous RF signals.

Figure 10:
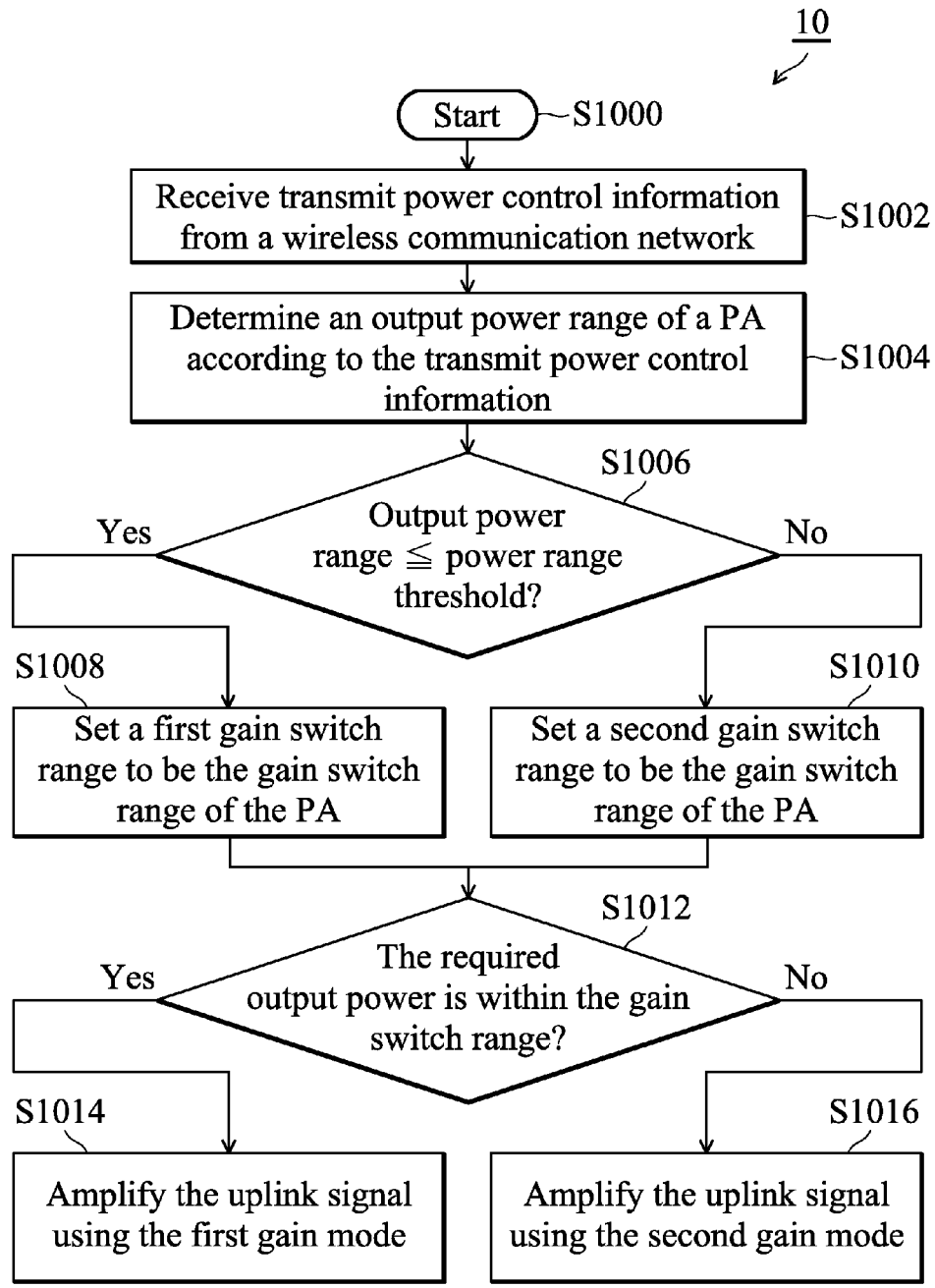
FIG. 10 is a flowchart of a power control method 10 according to an embodiment of the disclosure.

FIG. 10 is a flowchart of a power control method 10 according to an embodiment of the disclosure, incorporating the mobile device in FIG. 8 or FIG. 9. The power control method 10 may be initiated upon a power-up or when a power control application is initiated on the mobile device (S1000).

Next, the power control method 10 may constantly and periodically monitor a downlink signal sent from a wireless communication network by the mobile device to receive transmit power control information in the incoming RF signals (S1002). The transmit power control information may include, and is not limited to, Radio Resource Management (RRM), Transmit Power Control (TPC), and Quality of Service (QoS), or a network type of the wireless communication network.

Subsequently, the power control method 10 may determine an output power range of a PA according to the transmit power control information (S1004), and determine whether the output power range is less than a power range threshold (S1006). When the output power range is less than the power range threshold, the power control method 10 may determine that the output power range is narrow and set a low-gain switch range to be an gain switch range of the power amplifier PA in the mobile device (S1010), whereas when the output power range exceeds the power range threshold, the power control method 10 may determine that the output power range is wide and set a high-gain switch range to be the gain switch range of the power amplifier PA in the mobile device (S1012). The low-gain switch range and high-gain switch range may be defined as in the embodiments in FIG. 7.

Then, the power control method 10 may determine a gain of power amplifier PA according to the gain switch range by determining whether a required output power of an uplink signal is within the gain switch range of the power amplifier PA (S1012), when the required output power is within the gain switch range, amplify the uplink signal using a first gain mode (S1014), and when the required output power is outside of the gain switch range, amplify the uplink signal using a second gain mode (S1014). The power control method 10 may then be completed and exited (S1016).

Figure 11:
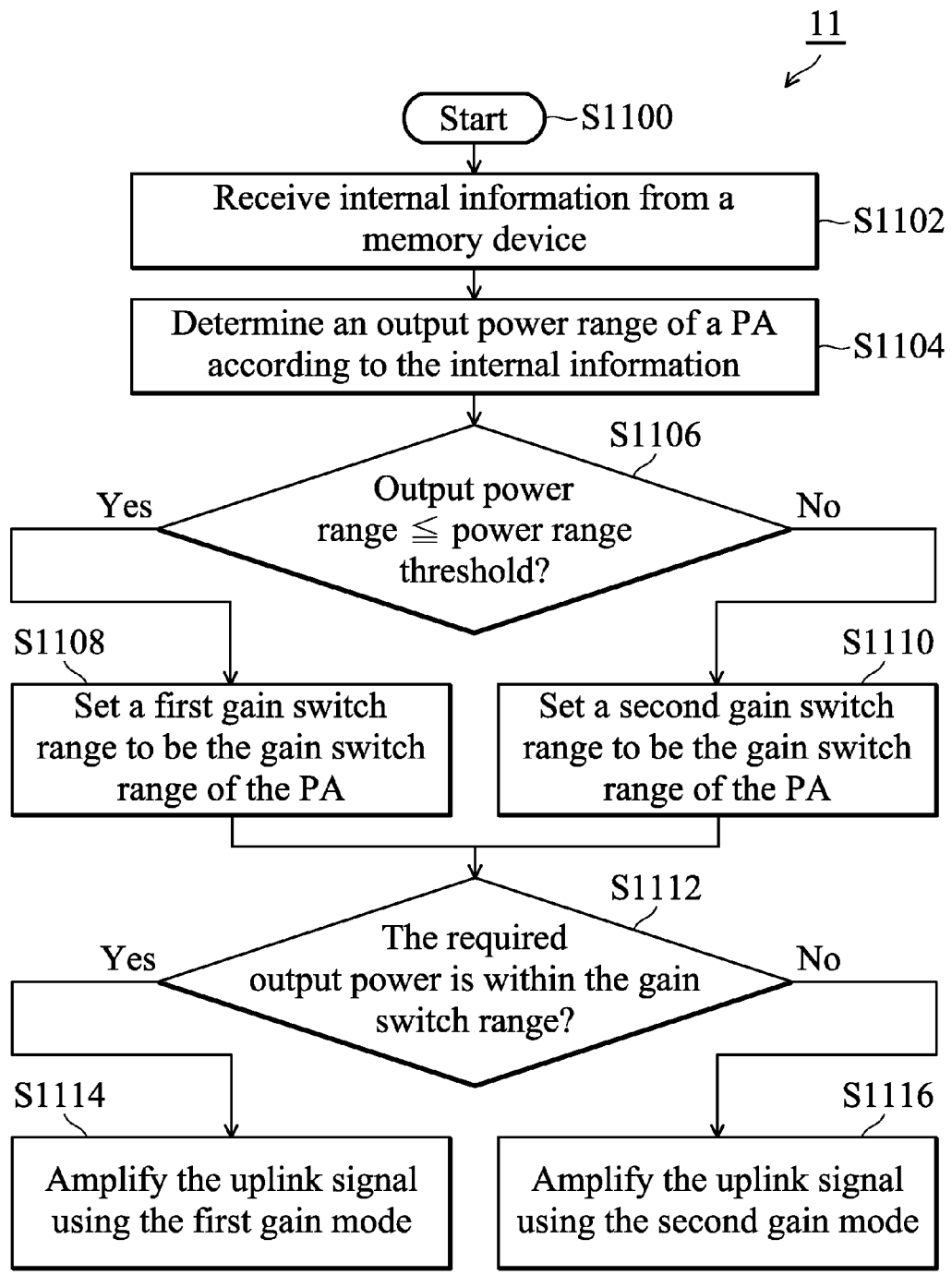
FIG. 11 is a flowchart of a power control method 11 according to another embodiment of the disclosure.

FIG. 11 is a flowchart of a power control method 11 according to another embodiment of the disclosure, incorporating the mobile device in FIG. 8 or FIG. 9. Steps S1100, and S1106 through S1116 may be identical to S1000, Steps S1006 through S1016 and will not be repeated here for breviary. Steps S1102 and S1104 are different from Steps S1002 and S1004 in FIG. 10 in that the power control method 11 may receive internal information from a memory device, which may be a local memory device in the mobile device (S1102), and then determine the output power range of the power amplifier PA according to the internal information (S1104). The internal information may be, but is not limited to, the transmission behavior of the transmitted data, the attachment status, the properties of the applications, and the user behavior, the transport data mode, and an operating mode such as the control data mode, the active mode, the inactive mode, the weekday mode, the holiday mode, the energy-saving mode, the performance oriented mode, and the balanced mode. Details of the internal information are described in the preceding sections.

The power control methods 10 and 11 may be utilized separately or conjointly in the mobile device to adaptively and dynamically determine a gain switch range of a power amplifier according to the transmit power control information and/or internal information, and selects a gain for the power amplifier to amplify an uplink signal for transmission accordingly. The adaptive and dynamic amplifier gain switch range of the power control methods 10 and 11 reduces power consumption and extends battery life, while supplying a sufficient transmit power to meet the power requirement for the two or more RF signals.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power control method, adopted by a mobile device, comprising:
   receiving transmit power control information from a wireless communication network;
   determining an output power range of an amplifier according to the transmit power control information;
   when the output power range is less than a power range threshold, determining a low-gain switch range as an amplifier gain switch range of the amplifier, wherein the low-gain switch range comprises a first upper bound and a first lower bound;
   when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound;
   when a transmit power of an uplink signal is within the amplifier gain switch range, amplifying the uplink signal with a first gain mode; and
   when the transmit power of the uplink signal is outside of the amplifier gain switch range, amplifying the uplink signal with a second gain mode.

2. The power control method of claim 1, wherein the transmit power control information comprises one information of Radio Resource Management (RRM), Transmit Power Control (TPC), and Quality of Service (QoS), and a network type of the wireless communication network.

3. The power control method of claim 1, wherein the step of receiving transmit power control information from a wireless communication network comprises: periodically receiving transmit power control information from a wireless communication network.

4. A power control method, adopted by a mobile device, comprising:
   receiving internal information from a memory device;
   determining an output power range of an amplifier according to the internal information;
   when the output power range is less than a power range threshold, determining a low-gain switch range as an amplifier gain switch range of the amplifier, wherein the low-gain switch range comprises a first upper bound and a first lower bound;
   when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound;
   when a transmit power of an uplink signal is within the amplifier gain switch range, amplifying the uplink signal with a first gain mode; and
   when the transmit power of the uplink signal is outside of the amplifier gain switch range, amplifying the uplink signal with a second gain mode.

5. The power control method of claim 4, wherein the step of determining the internal information of the mobile device comprises: determining the internal information of the mobile device based on an attachment status of the mobile device.

6. The power control method of claim 4, wherein the step of determining the internal information of the mobile device comprises: determining the internal information of the mobile device based on an application that is initiated on the mobile device.

7. The power control method of claim 4, wherein the step of determining the internal information of the mobile device comprises: determining the internal information of the mobile device based on a transmission behavior of transmitted data.

8. The power control method of claim 4, wherein the step of determining the internal information of the mobile device comprises: determining the internal information of the mobile device based on a historical user behavior in a predetermined period.

9. The power control method of claim 8, wherein the predetermined period includes one of a weekday, a weekend, a holiday, daytime and nighttime.

10. A mobile device, capable of adjusting a gain switch range, comprising:
an amplifier, configured to amplify an uplink signal with a gain mode;
a controller, configured to receive transmit power control information from a wireless communication network; and
an external information circuit, configured to determine an output power range of an amplifier according to the transmit power control information;
wherein when the output power range is less than a power range threshold, the controller is further configured to determine a low-gain switch range as an amplifier gain switch range of the amplifier, wherein the low-gain switch range comprises a first upper bound and a first lower bound;
when the output power range exceeds the power range threshold, the controller is further configured to determine a high-gain switch range as the amplifier gain switch range of the amplifier, wherein the high-gain switch range comprises a second upper bound and a second lower bound, the second upper bound is less than the first upper bound, and the second lower bound is less than the first lower bound;
when a transmit power of the uplink signal is within the amplifier gain switch range, the controller is further configured to select a first gain mode as the gain mode of the amplifier; and
when the transmit power of the uplink signal is outside of the amplifier gain switch range, the controller is further configured to select a second gain mode as the gain mode of the amplifier.

11. The mobile device of claim 10, wherein the transmit power control information comprises an allowable transmit power assigned by the wireless communication network for the mobile device to transmit the uplink signal.

12. The mobile device of claim 10, wherein the transmit power control information comprises a type of the wireless communication network.

13. A mobile device, capable of adjusting a gain switch range, comprising:
an amplifier, configured to amplify an uplink signal with a gain mode;
a memory, configured to store internal information;
an internal information circuit, configured to receive internal information from the memory, and determine an output power range of an amplifier according to the internal information; and
a controller, when the output power range is less than a power range threshold, configured to determine a low-gain switch range as an amplifier gain switch range of the amplifier, wherein the low-gain switch range comprises a first upper bound and a first lower bound, when the output power range exceeds the power range threshold, determine a high-gain switch range as the amplifier gain switch range of the amplifier, wherein the high-gain switch range comprises a second upper bound and a second lower bound, the second upper bound is less than the first upper bound, and the second lower bound is less than the first lower bound, when a transmit power of the uplink signal is within the amplifier gain switch range, select a first gain mode as the gain mode of the amplifier; and when the transmit power of the uplink signal is outside of the amplifier gain switch range, select a second gain mode as the gain mode of the amplifier.

14. The mobile device of claim 13, wherein the internal information circuit is configured to determine the internal information of the mobile device based on an attachment status of the mobile device.

15. The mobile device of claim 13, wherein the internal information circuit is configured to determine the internal information of the mobile device based on an application that is initiated on the mobile device.

16. The mobile device of claim 13, wherein the internal information circuit is configured to determine the internal information of the mobile device based on a transmission behavior of transmitted data.

17. The mobile device of claim 13, wherein the internal information circuit is configured to determine the internal information of the mobile device based on a user behavior.

18. A power control system, comprising:
first and second wireless communication networks, configured to broadcast first and second transmit power control information, respectively; and
a mobile device, configured determine an active network from the first and second wireless communication networks, receive one of the first and second transmit power control information broadcasted by the active network, determining an output power range of an amplifier according to the received one of the first and second transmit power control information, when the output power range is less than a power range threshold, determining a low-gain switch range as an amplifier gain switch range of the amplifier, wherein the low-gain switch range comprises a first upper bound and a first lower bound, when the output power range exceeds the power range threshold, determining a high-gain switch range as the amplifier gain switch range of the amplifier, wherein the high-gain switch range comprises a second upper bound and a second lower bound, the second upper bound is less than the first upper bound, and the second lower bound is less than the first lower bound, when a transmit power of an uplink signal is within the amplifier gain switch range, amplifying the uplink signal with a first gain mode; and when the transmit power of the uplink signal is outside of the amplifier gain switch range, amplifying the uplink signal with a second gain mode.

19. The power control system of claim 18, wherein the transmit power control information comprises one information of Radio Resource Management (RRM), Transmit Power Control (TPC), and Quality of Service (QoS), and a network type of the active network.

20. The power control system of claim 18, wherein the mobile device is configured to periodically receive the one of the first and second transmit power control information broadcasted by the active network.

* * * * *